(12) United States Patent
Hsiao

(10) Patent No.: US 6,884,100 B1
(45) Date of Patent: Apr. 26, 2005

(54) MECHANISM FOR FASTENING CARD IN EXPANSION SLOT

(76) Inventor: Mei Ling Hsiao, 4Fl. No. 27, Lane 160, Hsin Sheng S. Rd., Sec. 1, Taipei (TW)

( * ) Notice: Subject to any disclaimer, the term of this patent is extended or adjusted under 35 U.S.C. 154(b) by 0 days.

(21) Appl. No.: 10/937,280

(22) Filed: Sep. 10, 2004

(51) Int. Cl.⁷ .............................................. H01R 13/62
(52) U.S. Cl. ...................................................... 439/327
(58) Field of Search ................................ 439/325, 327, 439/328, 347

(56) References Cited

U.S. PATENT DOCUMENTS 5,650,917 A * 7/1997 Hsu ............................ 361/759
6,210,195 B1 * 4/2001 Ma ............................. 439/327
6,375,486 B1 * 4/2002 Yu .............................. 439/347
6,709,283 B1 * 3/2004 Lai ............................. 439/327

FOREIGN PATENT DOCUMENTS

TW            453461         9/1990

* cited by examiner

*Primary Examiner*—Thanh-Tam Le
(74) *Attorney, Agent, or Firm*—Troxell Law Office, PLLC

(57) ABSTRACT

A fastening mechanism of hollow parallelepiped comprises two ribs on an underside of a top, and a rail on an inner wall of either side. An expansion slot includes a bifurcation at one end with a well defined therebetween. Either branch of the bifurcation includes a top recessed first catch distal from one end, a top recessed second catch proximate one end, and an upright latch on an inner wall. Responsive to inserting the connector of a card into the expansion slot with a projection at one end of the connector entered the well and being fastened by the latches, push the mechanism toward the bifurcation for moving the ribs to pass the second catches to engage with the first catches as the branches slid into the mechanism to matingly engage with the rails.

8 Claims, 8 Drawing Sheets

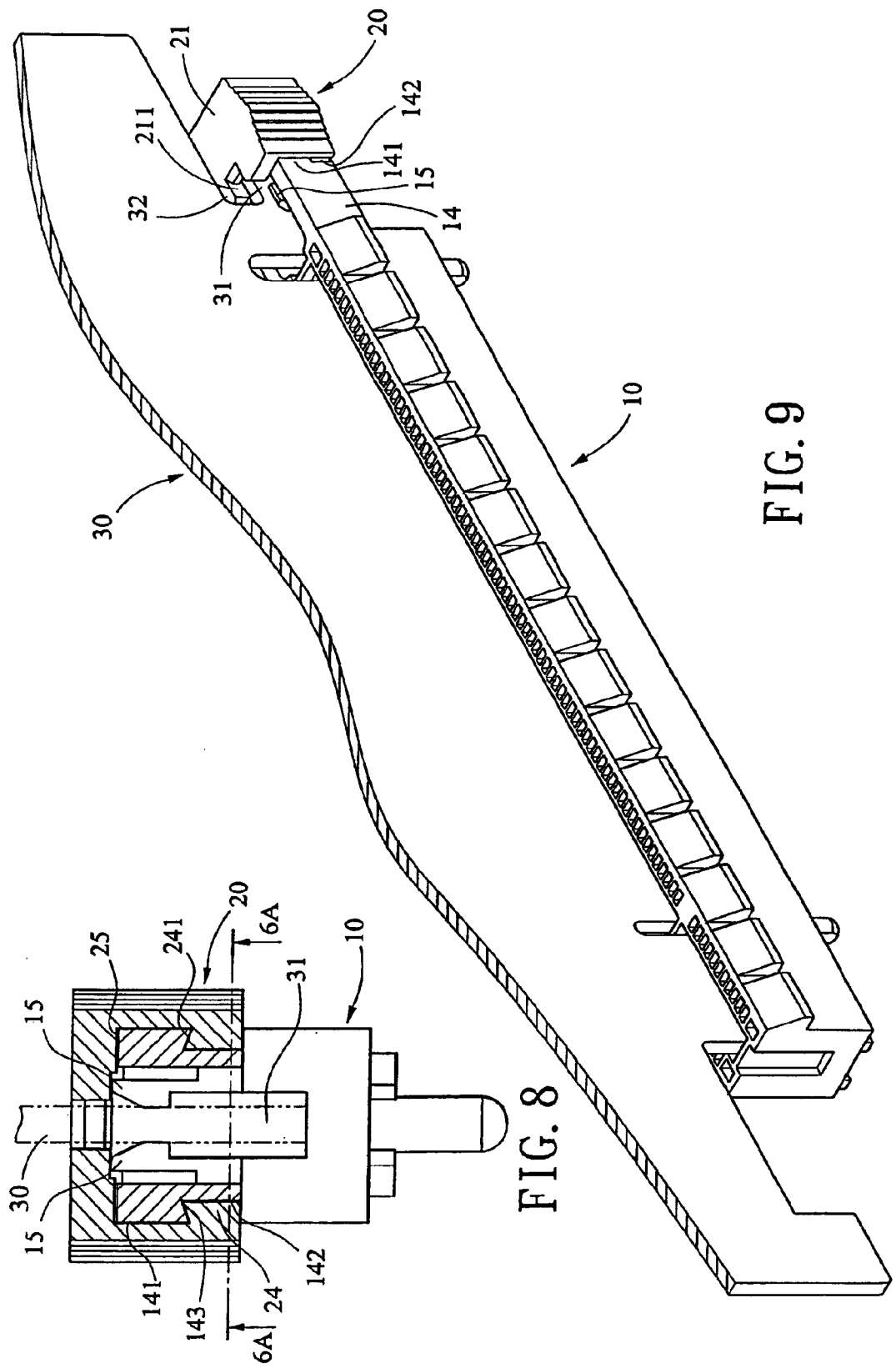

MECHANISM FOR FASTENING CARD IN EXPANSION SLOT

BACKGROUND OF THE INVENTION

1. Field of the Invention

The present invention relates to card fastening mechanisms and more particularly to an improved mechanism for releasably fastening a card in an expansion slot on the motherboard of a microcomputer.

2. Description of Related Art

A conventional AGP card fastening arrangement is shown in FIG. 10. As shown, an elongated expansion slot 90 comprises a lever 91 pivotably formed at one end and two lengthwise grooves 94. A card 92 comprises a recess 93 at one end of its connector side. To install the card 92, insert the connector of the card 92 into the grooves 94. Next, pivot the lever 91 to the end to clamp the card 92 in the recess 93.

However, the prior art suffered from several disadvantages. For example, a relatively large space is required to perform the lever pivoting. Also, such pivoting is somewhat difficult since little space is available after inserting the connector of the card 92 into the expansion slot 90. It is often that the fastening is not reliable. As such, the fastening may be compromised after a short time of use, particularly in a vibratory environment.

Taiwanese Patent Publication No. 453,461 discloses another AGP card fastening arrangement as detailed below. An AGP expansion slot 2 comprises a projected rail 21 at either side, the rail 21 having a length less than half of the total length of the expansion slot. A hole 211 is formed at an inner end of the rail 21. A U-shaped frame 22 comprises a groove 221 at an inner surface of either side arm, a tab 222 at an open end of the groove 221, and a raised cross member 223 interconnected both side arms. The frame 22 and the rails 21 form a slide with the grooves 221 being slidable along the rails 21. After inserting an AGP card 3 into the expansion slot 2, push the frame 22 toward the expansion slot 2 until the tabs 222 enter the holes 211 and the cross member 223 receives in a cavity 31 at one end of the connector side of the card 3 for fastening the card 3. It is understood that a reverse operation can detach the card 3 from the expansion slot 2.

However, the patent suffered from several disadvantages. For example, the coupling of the expansion slot 2 and the frame 22 depends on the slide. Unfortunately, due to limited space reason, both the grooves 221 and the rails 21 are much relatively small elements, resulting in a difficulty of precisely assembling them together. To the worse, a slight deflection of either arm of the frame 22 may compromise the desired mated engagement of the grooves 221 and the rails 21. As stated above, the card 3 is fastened after pushing the frame 22 toward the expansion slot 2 with the tabs 222 entered the holes 211 and the cross member 223 received in the cavity 31. However, such pushing may be difficult since the coupled grooves 221 and the rails 21 cannot provide a sufficient support force thereto. In an extreme condition, at least one of the grooves 221 and the arms of the frame 22 is deformed, dislodged, or even broken. It is also understood that the positioning of the frame 22 with respect to the expansion slot 2 depends on the engagement of the tabs 222 and the holes 211. However, such positioning is not reliable since contact areas of the tabs 222 and the holes 211 are much more relatively small. It is often that a slight vibration of the card 3 may dislodge the frame 22, resulting in failure of the positioning. In addition, a click indicating an exact engagement of the tabs 222 and the holes 211 is hardly heard during the pushing operation. It is more often that a user may push the frame 22 excessively to dislodge the tabs 222 from the holes 211 and the user is often not aware of it. Thus, the need for improvement still exists.

SUMMARY OF THE INVENTION

It is an object of the present invention to provide a mechanism for fastening a card in an expansion slot on the motherboard of a computer in a simple, convenient operation.

It is another object of the present invention to provide a mechanism for releasably fastening a card in an expansion slot on the motherboard of a computer.

To achieve the above and other objects, the present invention provides a mechanism for fastening a card in an expansion slot on a motherboard of a computer, the card including a connector at one side and a projection at one end of the connector, and the expansion slot including a bifurcation at one end with a well defined therebetween, either branch of the bifurcation including an extension, a recessed first catch formed on a top of the extension and being distal from one end, and a recessed second catch formed on the top of the extension and being proximate one end, the mechanism being substantially a hollow parallelepiped and being open to both a first side facing the bifurcation and a bottom, the mechanism comprising two ribs formed on an underside of a top; and a cavity formed on an inner wall of either of second and third sides; wherein responsive to inserting the connector of the card into the expansion slot with the projection entered the well, push the mechanism toward the bifurcation or moving the ribs to pass the second catches to engage with the first catches the extensions slid into the cavities to matingly engage therewith.

The above and other objects, features and advantages of the present invention will become apparent from the following detailed description taken ith the accompanying drawings.

BRIEF DESCRIPTION OF THE DRAWINGS

FIG. 8 is another schematic sectional view from line 8—8 of FIG. 6B for illustrating components shown in FIG. 6B;

FIG. 9 is a perspective view of the assembled card and expansion slot being fastened by the mechanism.

DETAILED DESCRIPTION OF THE PREFERRED EMBODIMENTS

Figure 1:
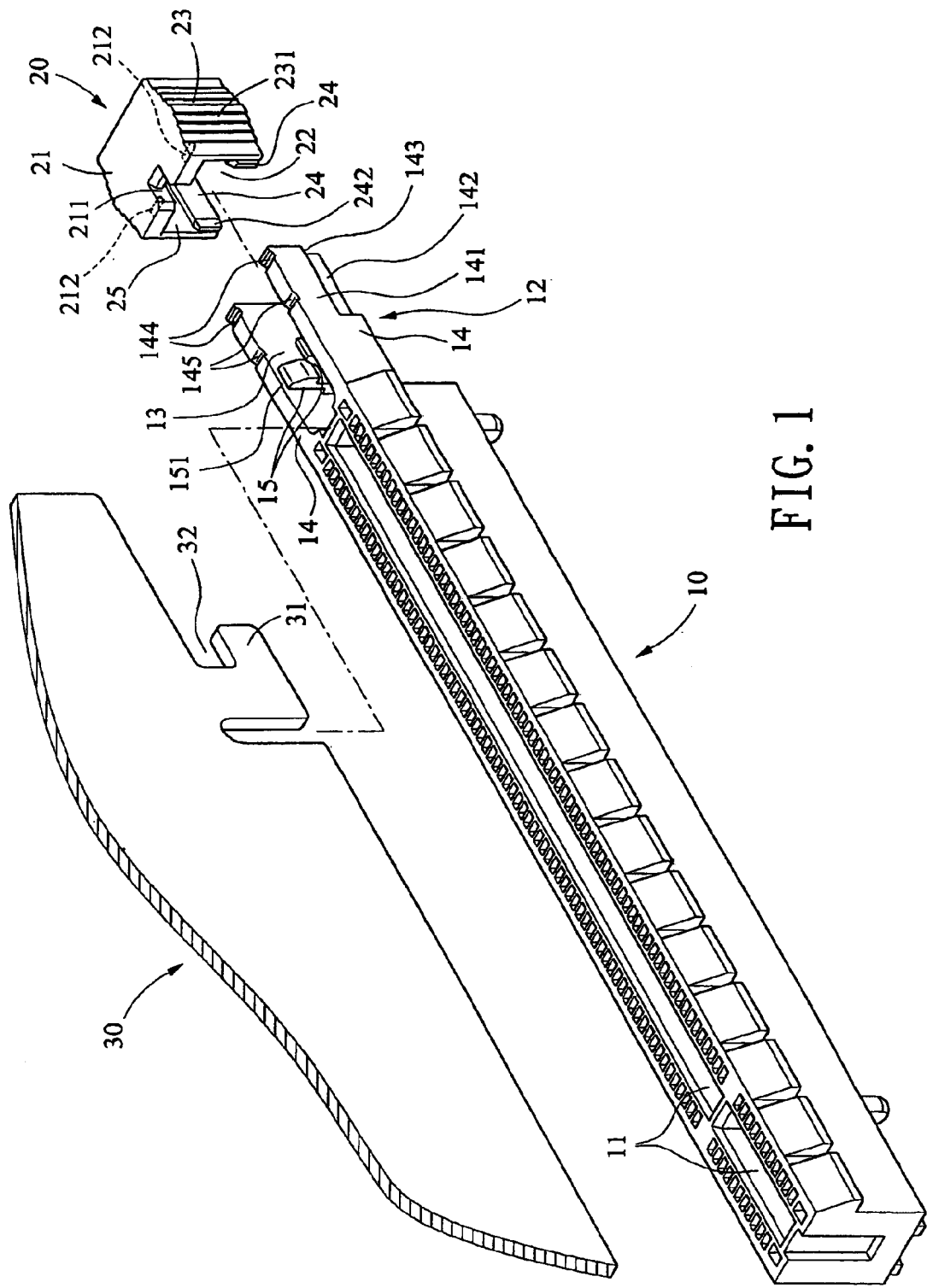
FIG. 1 is an exploded perspective view of a card, an expansion slot, and a mechanism according to the invention for fastening the card in the expansion slot.
Figure 3:
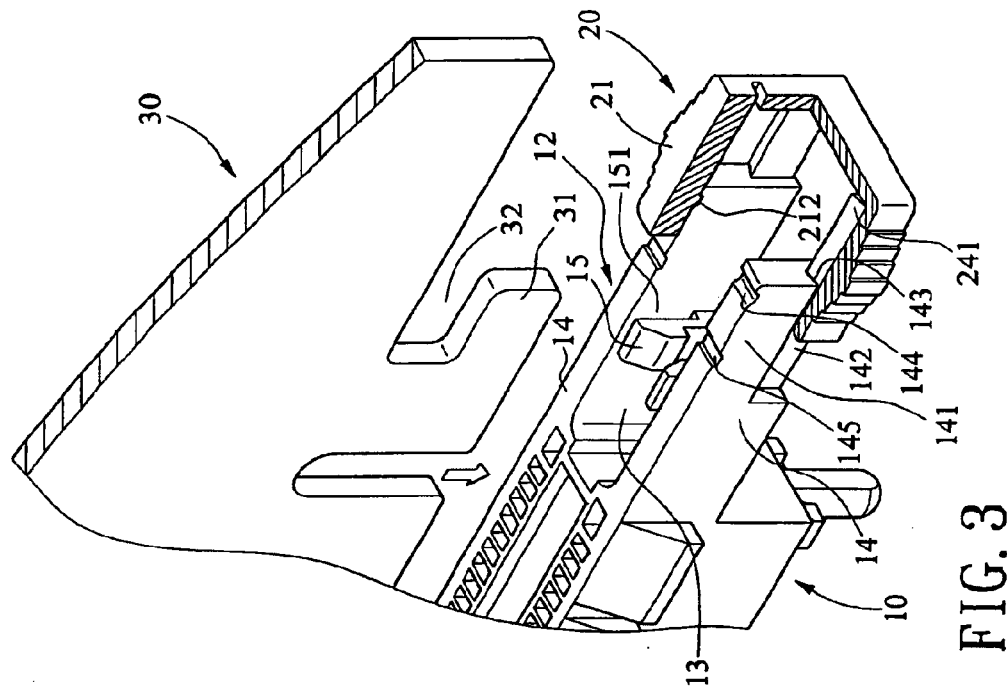
FIG. 3 is a view similar to FIG. 2 where the mechanism is engaged with one end of the expansion slot by snapping and the card is about to insert in the expansion slot.
Figure 2:
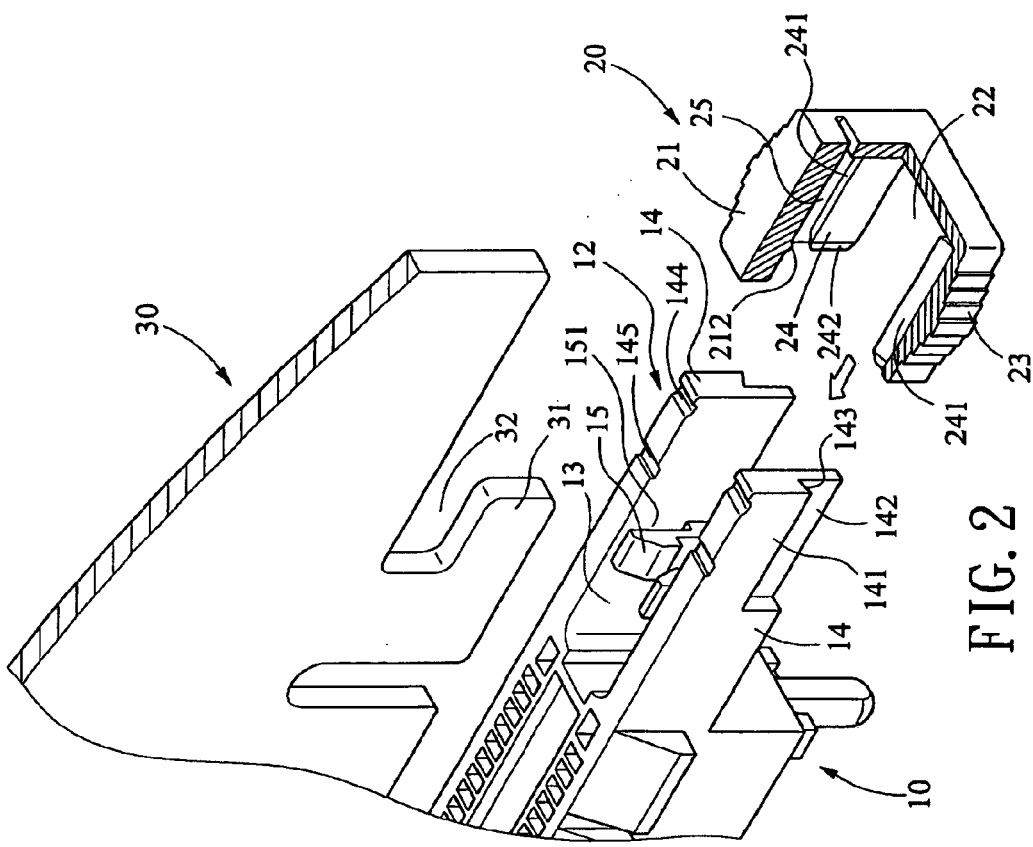
FIG. 2 is a greatly enlarged view of portions of the card and the expansion slot proximate the mechanism shown in its broken-away perspective view.
Figure 4:
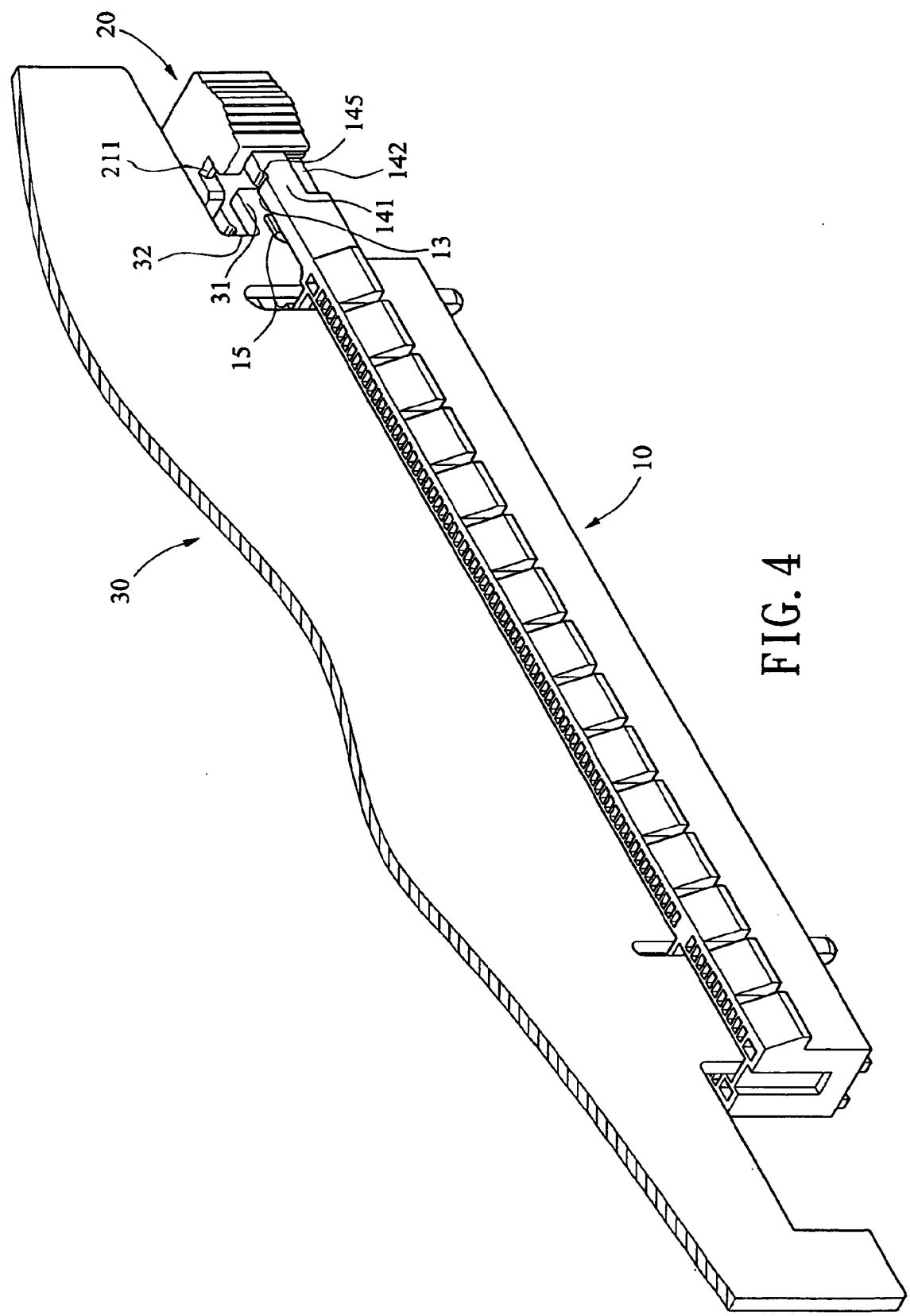
FIG. 4 is a perspective view of the assembled card and expansion slot yet to be fastened by the mechanism.
Figure 5A:
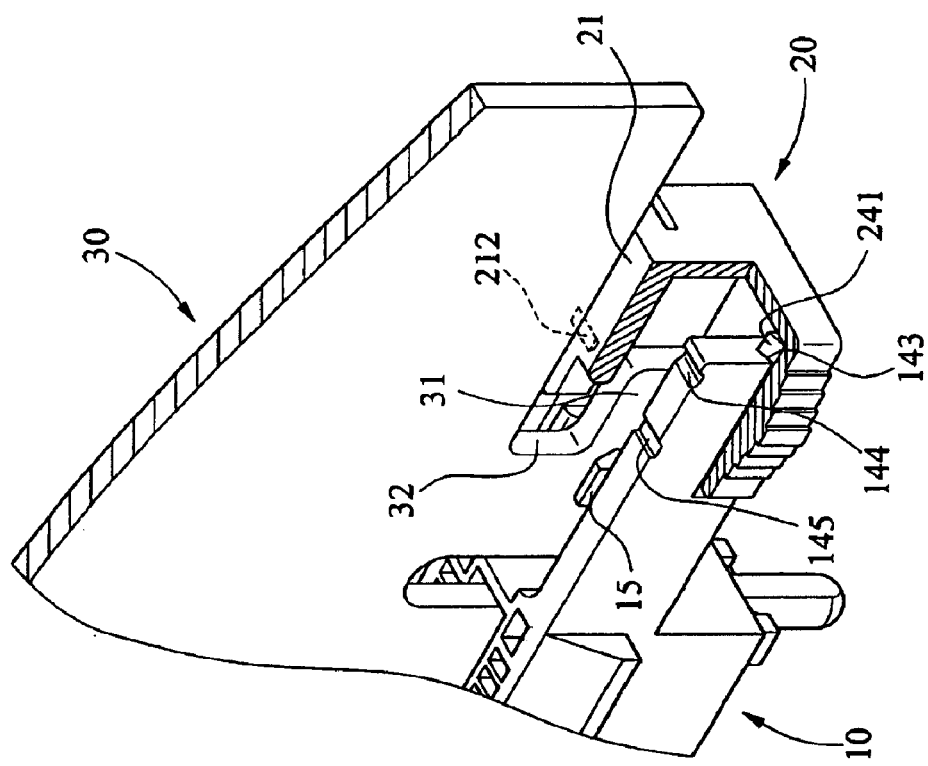
FIG. 5A is a greatly enlarged view of portions of the assembled card and the expansion slot of FIG. 4 showing the relationship between the rib of the mechanism and the second catch in its broken-away perspective view.
Figure 5B:
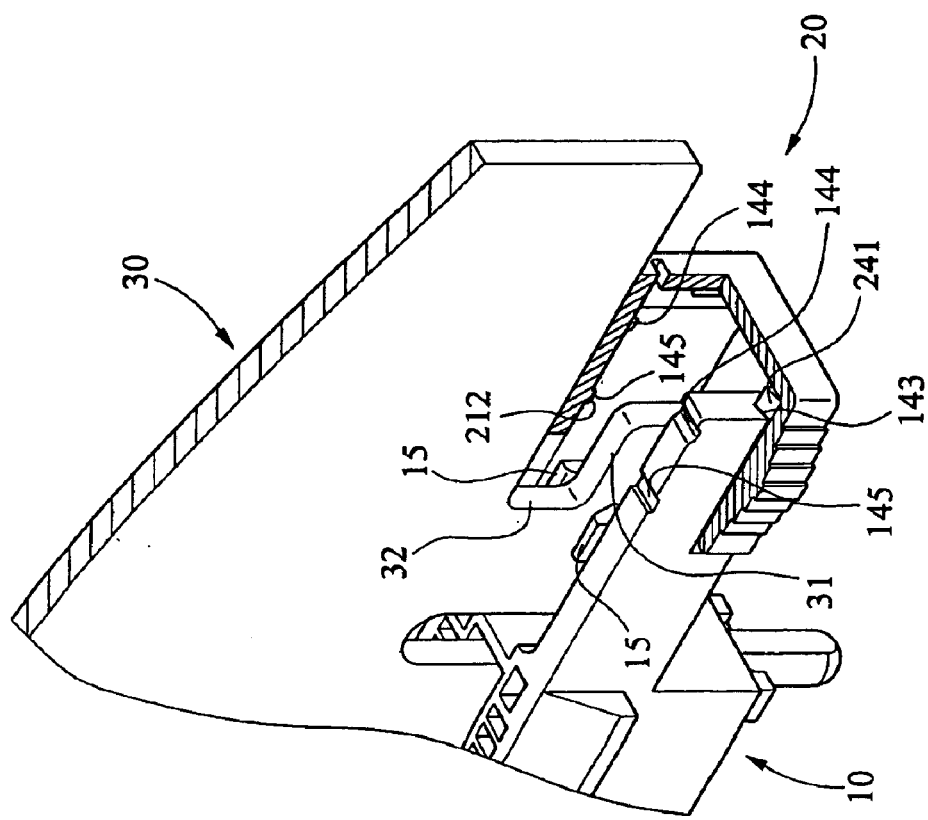
FIG. 5B is a view similar to FIG. 5A for showing the projection of card being in a position under the top of the mechanism.
Figure 6A:
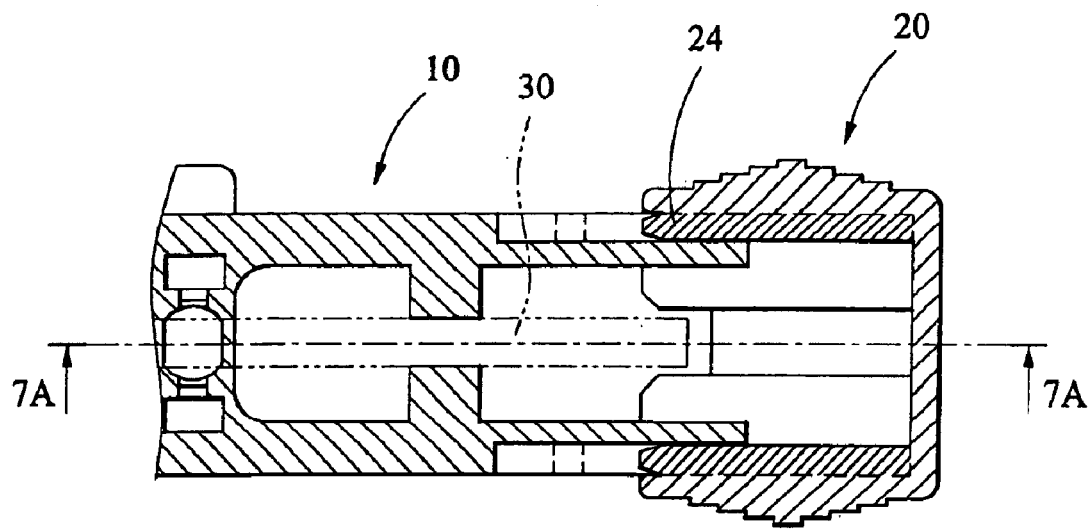
FIG. 6A is a sectional view of the card, the expansion slot, and the mechanism from line 6A—6A of FIG. 8.
Figure 6B:
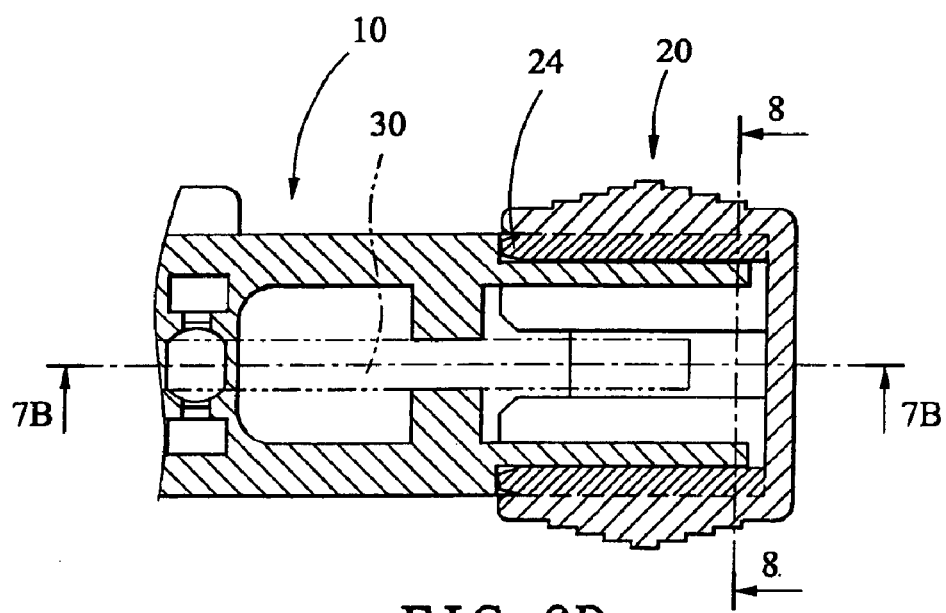
FIG. 6B is a view similar to FIG. 6A where one ends of the assembled card and the expansion slot are fully received in and fastened by the mechanism.
Figure 7A:
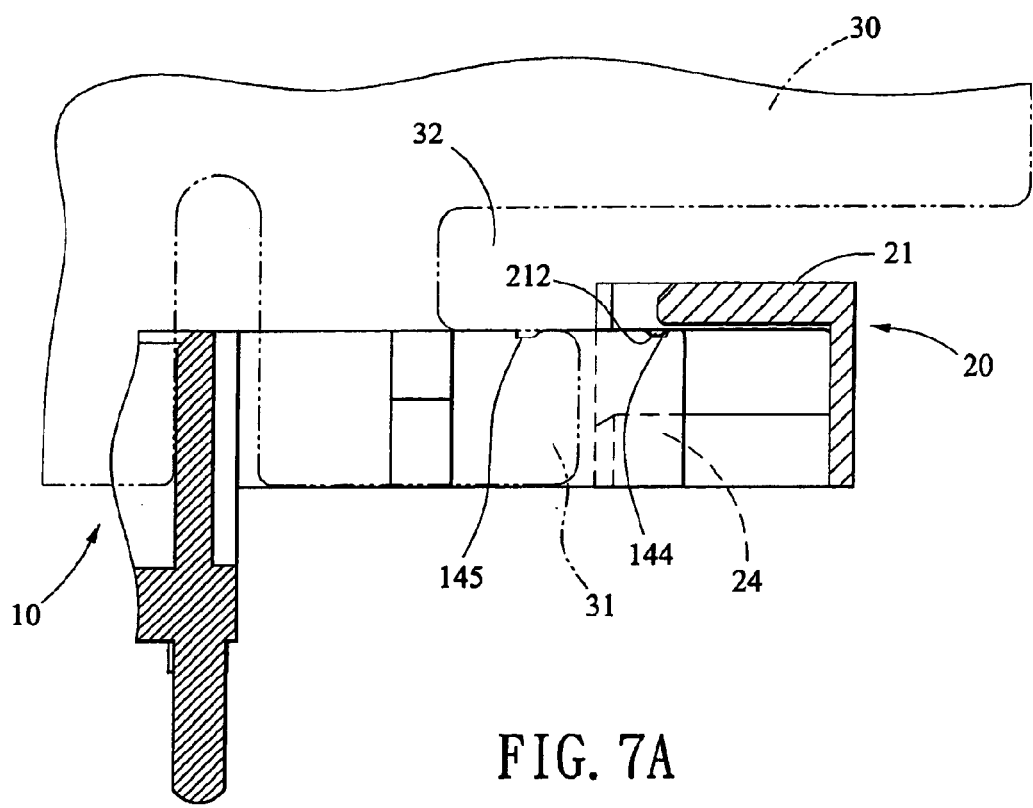
FIGS. 7A and 7B are schematic sectional views from line 7A—7A and 7B—7B of FIGS. 6A and 6B, respectively for illustrating components shown in FIGS. 6A and 6B respectively.
Figure 7B:
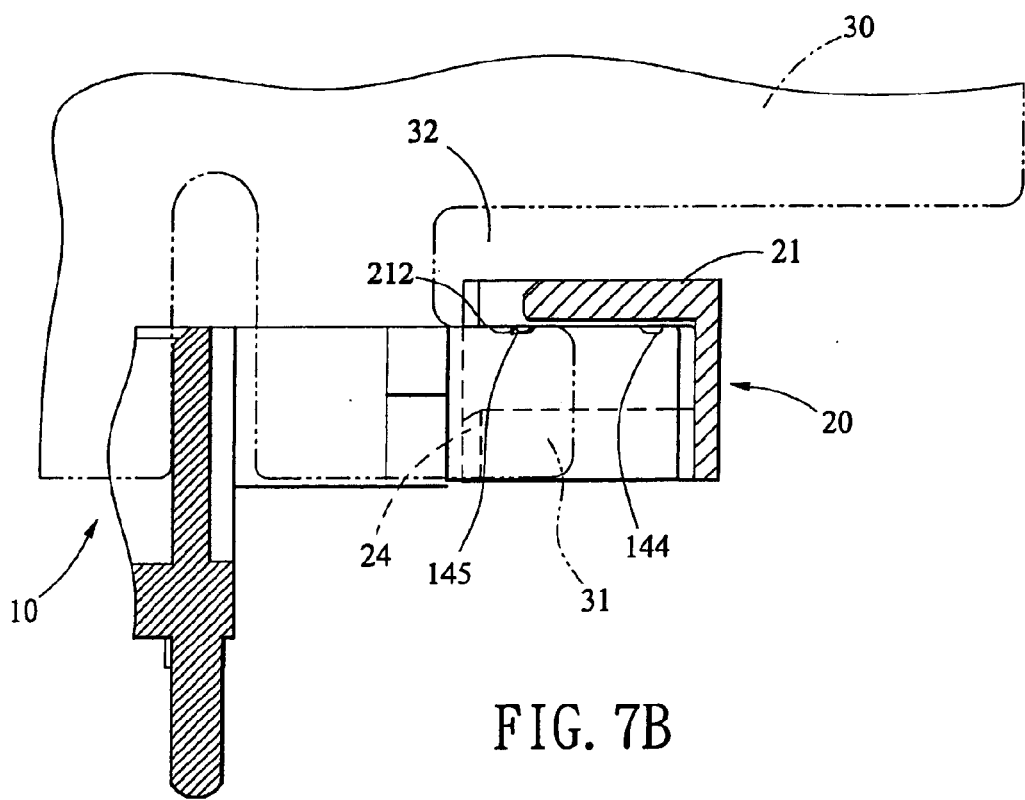
Figure 10:
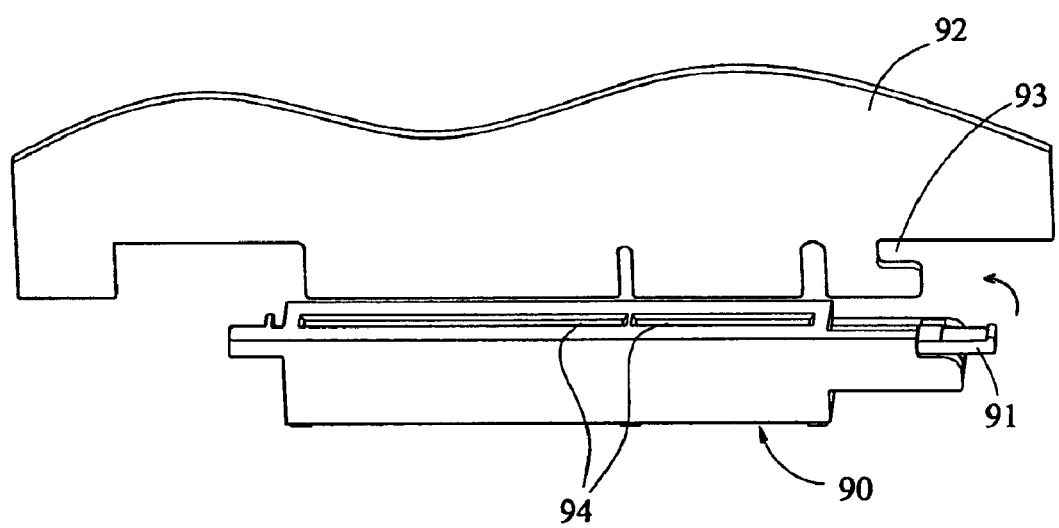
FIG. 10 is a perspective view illustrating an insertion of a card in an expansion slot and a fastening thereof by means of a conventional mechanism.

Referring to FIGS. 1 to 9, there is shown a mechanism 20 for fastening a card 30 in an expansion slot 10 on the motherboard of a microcomputer in accordance with a preferred embodiment of the invention. Each component will be described in detailed below.

The elongated expansion slot 10 comprises two lengthwise grooves 11 having conductors (not shown) formed therein to be electrically connected to the inserted connector of the card 30. The expansion slot 10 further comprises a bifurcated ear portion 12 at one end. The ear portion 12 comprises two branches 14, a well 13 between two branches 14, and a latch 15 on an inner wall of either branch 14, the latch 15 having an upward end spaced apart from the branch 14 by a gap 151 such that the latch 15 is adapted to flexibly fasten the card 30 in cooperation with the mechanism 20 as detailed later. The branch 14 comprises an extension 141, a recessed flat 142 extended downward from the extension 141, an oblique shoulder 143 (see FIG. 8) between the extension 141 and the flat 142, a top recessed first catch 144 proximate the open end of the extension 141, and a top recessed second catch 145 distal from an open end of the extension 141.

The mechanism 20 is substantially a hollow parallelepiped in shape and is open to both a side surface facing the ear portion 12 and a bottom (i.e., detent) 22. An indentation 211 is formed on a top 21. Two ribs 212 are formed on an underside of the top 21 and are spaced apart by the indentation 211. A ridged section 231 is formed on either side surface 23 for facilitating the pushing or pulling of the mechanism 20 with respect to the ear portion 12. A transverse rail 24 is provided on an inner wall of either side surface 23 to define a cavity 25 between itself and the underside of the top 21. The rail 24 comprises an oblique top 241 mated with the shoulder 143 (see FIG. 8), and an oblique open end 242 (see FIGS. 1 and 2) for facilitating the coupling of the mechanism 20 to the ear portion 12 in the pushing operation.

An installation of the invention will be described in detailed below. Push the mechanism 20 toward the ear portion 12 with the extensions 141 slid into the cavities 25 and the oblique tops 241 matingly engaged with the shoulders 143 (see FIGS. 2 and 8). Also, the ribs 212 engage with the first catches 144 at the end of a first stage of the pushing (see FIGS. 3, 4, 6A and 7A).

After inserting the connector of the card 30 into the grooves 11 and causing a projection 31 at one end of the connector side of the card 30 to pass the indentation 211, the projection 31 enters the well 13 and is clamped by the latches 15 (see FIGS. 4, 5A, 5B and 8). A further pushing of the mechanism 20 will move the ribs 212 along tops of the extensions 141 until the ribs 212 engage with the second catches 145. At this position, a recess 32 defined by a top of the projection 31 and the other portion of the card 30 is matingly engaged with the indentation 211. This finishes the coupling of the mechanism 20 and the ear portion 12 with the card 30 being fastened by the mechanism 20 (see FIGS. 5A, 6B, 6B, 7B, and 9).

A simple pulling of the mechanism 20 away from the ear portion 12 by holding the ridged sections 231 will disengage the mechanism 20 therefrom. Further, an upward pulling of the card 30 will detach the card 30.

While the invention herein disclosed has been described by means of specific embodiments, numerous modifications and variations could be made thereto by those skilled in the art without departing from the scope and spirit of the invention set forth in the claims.

What is claimed is:

1. A mechanism for fastening a card in an expansion slot on a motherboard of a computer, the card including a connector at a lower side and a projection at one end of the connector, and the expansion slot including a bifurcation at one end with a well defined therebetween, the bifurcation comprising two branches, each branch including an extension, a recessed first catch formed on a top of the extension and being proximate one end of the extension, and a recessed second catch formed on the top of the extension and being distal from one end of the extension, the mechanism being substantially a hollow parallelepiped and being open to both a first side facing the bifurcation and a bottom, the mechanism comprising:

a top;

a second and third sides extending downward from the top;

two ribs formed on an underside of the top; and a cavity formed on an inner wall of either of the second and third sides;

wherein responsive to inserting the connector of the card into the expansion slot with the projection of the card entered the well of the expansion slot, push the mechanism toward the bifurcation of the expansion slot for moving the ribs of the mechanism to pass the first catches to engage with the second catches of the extensions as the extensions slid into the cavity to matingly engage therewith.

2. The mechanism of claim 1, wherein either of the two branches further comprises an upright latch formed on an inner wall.

3. The mechanism of claim 1, wherein either of the two branches further comprises a recessed flat extended downward from the extension.

4. The mechanism of claim 3, further comprising an oblique shoulder formed between the extension and the recessed flat.

5. The mechanism of claim 1, further comprising an indentation formed on the top of the mechanism facing the bifurcation.

6. The mechanism of claim 4, further comprising a transverse rail formed below the cavity, the rail being shaped to matingly engage with the recessed flat.

7. The mechanism of claim 6, wherein the rail comprises an oblique top mated with the shoulder.

8. The mechanism of claim 1, further comprising a ridged section formed on an outer surface of either of the second and the third sides.

* * * * *